United States Patent [19]

Zenitani et al.

[11] Patent Number: 5,243,218
[45] Date of Patent: Sep. 7, 1993

[54] COOLING STRUCTURE FOR ELECTRONICS DEVICES

[75] Inventors: Hideki Zenitani; Mitsuo Okawachi; Hisato Sato; Haruhiko Horizoe; Naoya Yamazaki, all of Kawasaki, Japan

[73] Assignee: Fujitsu Limited, Kawasaki, Japan

[21] Appl. No.: 794,221

[22] Filed: Nov. 19, 1991

[30] Foreign Application Priority Data

Nov. 22, 1990 [JP] Japan .................................. 2-315782

[51] Int. Cl.$^5$ ...................... H01L 23/02; H01L 23/16
[52] U.S. Cl. .................................. 257/712; 257/718; 257/723; 257/730
[58] Field of Search ...................... 357/81, 74, 75, 68; 361/386; 174/16.3; 257/712, 713, 718, 723, 730, 773

*Primary Examiner*—Mark V. Prenty
*Attorney, Agent, or Firm*—Staas & Halsey

[57] ABSTRACT

A cooling structure for LSI or the like devices to be mounted in a small size electronic apparatus housing. A main printed circuit board has mounted thereon first electronic devices with low heat generation; at least one auxiliary printed circuit board has mounted thereon a second electronic device with high heat generation, which is connected with one edge of the main printed circuit board (1) through a flexible printed circuit tape (5); a holder (6) fixed on the main printed circuit board (1) for resiliently supporting the auxiliary printed circuit board (2) at a distance above the former when the latter is turned over and is above the main printed circuit board (1) by bending the flexible printed circuit tape (5) so that a heat conductive surface of the second electronic device (4) is exposed outside. This printed circuit board assembly (A) is accommodated in a housing (B) made of a heat conductive material so that the heat conductive surface of the second electronic device (4) is brought into close and resilient contact with the inner wall (14) of the hosing (B).

5 Claims, 7 Drawing Sheets

COOLING STRUCTURE FOR ELECTRONICS DEVICES

BACKGROUND OF THE INVENTION

1. Field of the Invention

The present invention relates to a structure for effectively discharging heat, generated by electronic devices, from or out of an electronic apparatus housing on or within which the former are mounted, such as a telecommunication apparatus housing. Particularly, the present invention is suitably applied to thin and small sized electronic apparatuses of a type typified by a single main printed circuit board.

2. Description of the Related Arts

Electronic apparatuses have become small-sized in accordance with the development of LSI technology. Accompanied therewith, the removal of heat, generated by such densified electronic devices, out of a system (or housing) within which they are installed has been a serious problem. Particularly, in small-sized apparatuses with a volume of less than 1 l, and since there is no space for providing a fan to forcibly cool the electronic devices, it is necessary to adopt a natural cooling system.

Figure 8A:
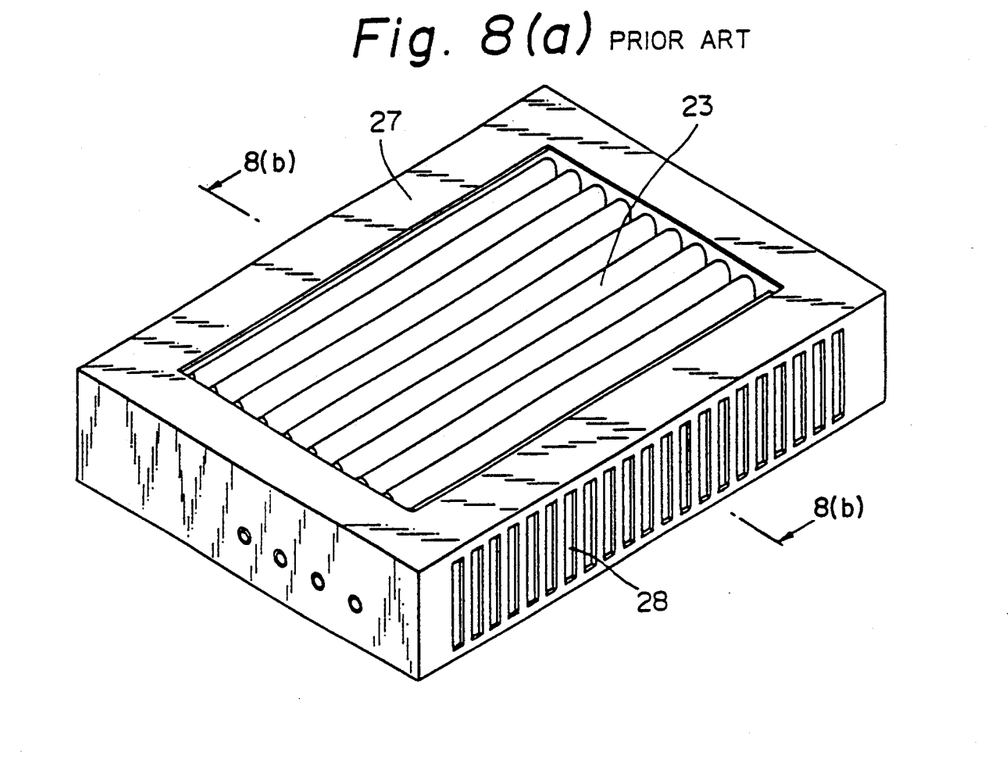
FIG. 8(a) is a perspective view of the conventional cooling structure.
Figure 8B:
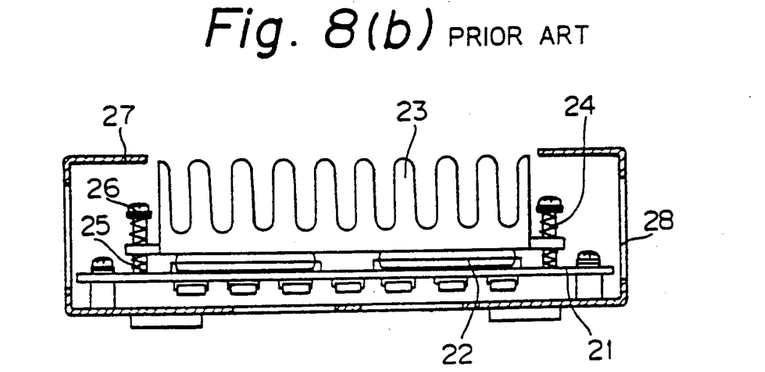
FIG. 8(b) is a sectional view in a plane along a line 8b—8b of FIG. 8(a).

As shown in FIG. 8(a) and 8(b), the conventional cooling structure comprises a fin plate 23 common to plural electronic devices 22, such as plural LSI devices, mounted on a printed circuit board 21. The fin plate 23 is positioned so as to be in contact with the respective heat-conductive surfaces of the electronic devices 22 and fixed on the printed circuit board 21 by means of screws 26. Upper and lower springs 24, 25 are arranged around the respective upper and lower halves of each corresponding screw 26 so that close contact between the fin plate 23 and the electronic devices 22 is enhanced, while protecting the latter from the weight of the former. Reference numerals 27, 28 designate, respectively, a housing and a ventilation opening.

The above prior art cooling structure has the following drawbacks:

1) A connection area between the printed circuit board and the electronic devices mounted thereon is liable to be damaged by vertical vibration caused by the heavy fin plate supported in a floating manner above the printed circuit board by the springs.

2) It is very difficult to bring all electronic devices, such as LSI devices, into close and uniform contact with the common fin plate, because said electronic devices have inherent manufacturing dimensional errors (i.e., variations) in the outer dimensions thereof, to which variations of the thickness of solder in the connection area is further added. This tendency of having dimensional variations is particularly pronounced when the printed circuit board has a curvature and is under torsion. Of course, this prior art cooling structure system cannot be adopted if any of the electronic devices to be mounted on the printed circuit board has a height different from the others.

3) The problems cited in item 2) can be solved by providing a separate and respective, individual fin plate on each of the plural electronic devices, but this results in a considerable reduction of the mounting efficiency of same.

4) The number of parts increases, resulting in higher manufacturing costs.

SUMMARY OF THE INVENTION

Accordingly, it is an object of the present invention to solve the above said drawbacks of the prior art and to provide a novel cooling structure of electronic devices mounted on a printed circuit board, which structure can be used even when the respective heights of the electronic devices are somewhat different from each other.

This object is achieved by a cooling structure for the electronic devices, such as LSI devices, mounted in the electronic apparatus housing, comprising a main printed circuit board having mounted thereon first electronic devices which produce low heat generation; at least one auxiliary printed circuit board having mounted thereon second electronic device which produce high heat generation and each of which is connected with one edge of the main printed circuit board by a flexible printed circuit tape; a holder fixed on the main printed circuit board for resiliently supporting the auxiliary printed circuit board at a distance above the former when the latter is rotated and translated to a position parallel to and spaced from the main printed circuit board by bending the flexible printed circuit tape so that heat conductive surface of the second electronic device mounted thereon is positioned remotely from the main and auxiliary boards and thereby exposed to the exterior; and a heat conductive means tightly brought into contact with the heat conductive surface of the second electronic device for transferring heat from the second electronic device to the outside.

Preferably, the heat conductive means is part of a housing, made of heat conductive material, which accommodates, or houses a printed board assembly comprising the main and auxiliary printed circuit boards and holders, and which is pressed onto the second electronic device when the printed circuit board assembly is accommodated in the housing.

Advantageously, the heat conductive means is a box-like upper half body of the housing, provided with a plurality of fins extended inwardly at a ridge line thereof.

Favorably, the upper half body of the housing has a thicker inner wall portion at a position corresponding to that of the second electronics device to enhance the heat conductance contact therebetween.

BRIEF DESCRIPTION OF THE DRAWINGS

These and further objects and advantages of the present invention will be more apparent from the preferred embodiments illustrated in the attached drawings; wherein.

DESCRIPTION OF THE PREFERRED EMBODIMENTS

A principle of the present invention will be explained with reference to FIGS. 1(a) through 4.

Figure 1A:
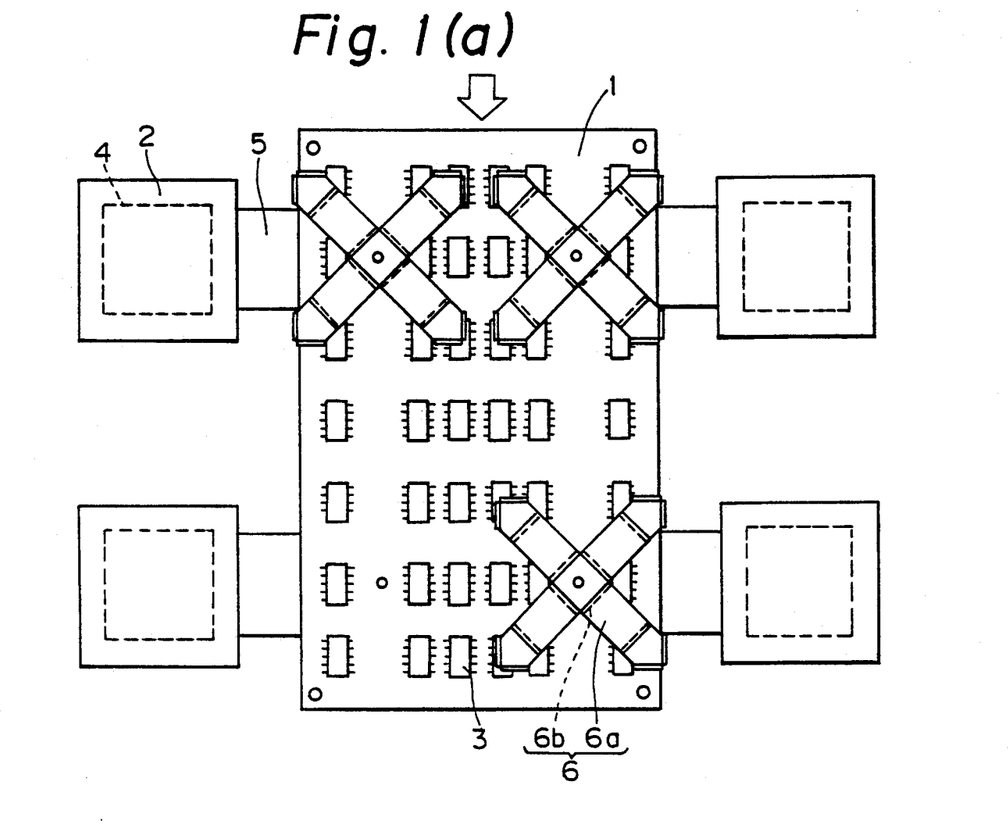
FIG. 1(a) is a plan view of a straight printed circuit board assembly according to the present invention.
Figure 1B:
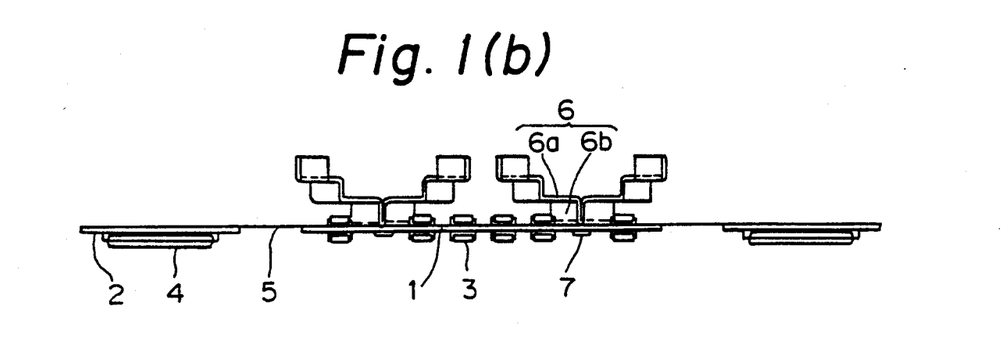
FIG. 1(b) is an and elevational view in the arrowed direction of FIG. 1(a)

An electronic circuit package assembly according to the present invention comprises a large size single main printed circuit board 1 and four small size auxiliary printed circuit boards 2, as shown in FIGS. 1(a) and 1(b). The number of auxiliary printed circuit boards 2 is not limited to four but must be at least one.

Electronic devices 3 are mounted on the main printed circuit board 1; the devices 3 are of a type, such as IC's, which generate a relatively low level of heat during the operation thereof (hereinafter referred to as "first electronic devices"). By contrast, each electronic device 4 mounted on a respective auxiliary printed circuit board 2 is of a type, such as an LSI device, which generates a relatively greater level of heat during the operation thereof (hereinafter referred to "a second electronics device").

The plural auxiliary printed circuit boards 2 are connected to respectively corresponding parallel opposite edges of the main printed circuit board 1, each by a flexible printed circuit tape 5 which affords signal transmission therebetween.

Figure 2A:
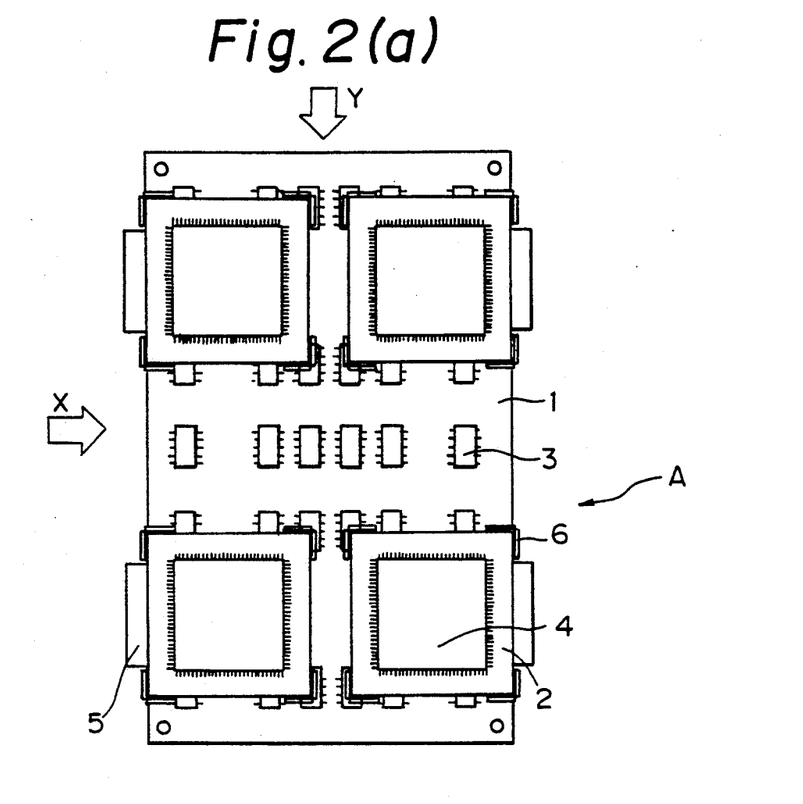
FIG. 2(a) is a plan view of a bent printed circuit board assembly according to the present invention.
Figure 2B:
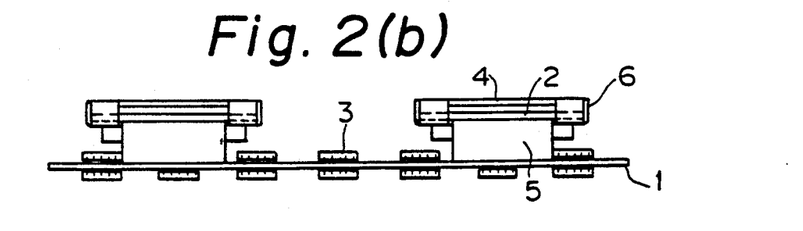
FIG. 2(b) is a side elevational view in the arrowed direction X of FIG. 2(a)
Figure 2C:
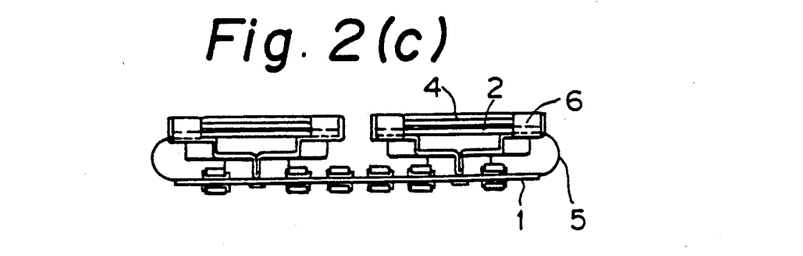
FIG. 2(c) is an end elevational view in the arrowed direction Y o f FIG. 2(a)

As shown in FIGS. 2(a), 2(b) and 2(c), each auxiliary printed circuit board 2 is rotated and translated to an inverted position parallel to and displaced from the main printed circuit board 1, by bending the flexible printed circuit tape 5 into a U-shape, so that the heat conductive surface of each second electronic circuit device 4 is facing up, as seen in FIG. 2(b), and thus from the surface of board 2 which is remote from board 1.

Figure 3A:
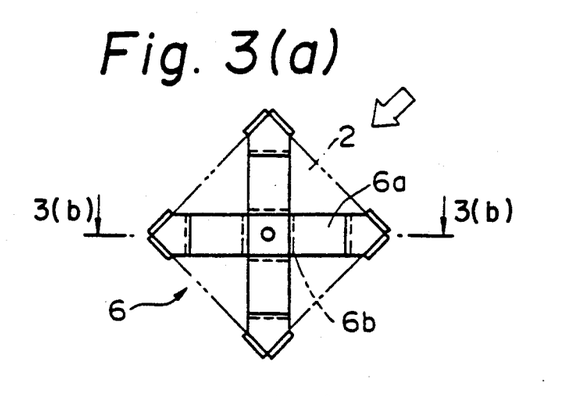
FIG. 3(a) is a plan view of a holder for supporting an auxiliary printed circuit board.
Figure 3B:
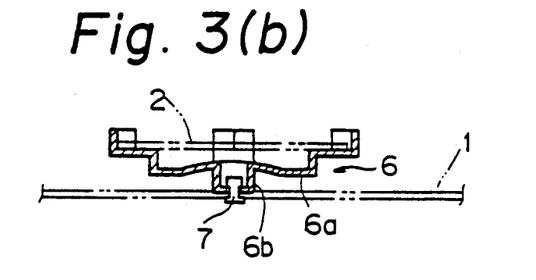
FIG. 3(b) is a cross-sectional view in a plane along a line [I—I] 3b—3b of FIG. 3(a)
Figure 3C:
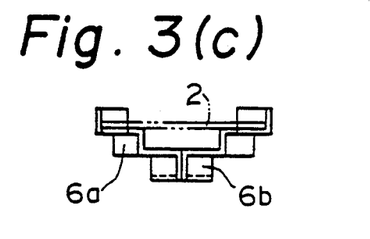
FIG. 3(c) is a side elevational view in the arrowed direction of FIG. 3(a)

The main printed circuit board 1 has a holder 6, shown in FIGS. 3(a), 3(b) and 3(c), comprising a cross-shaped spring member 6a made of stainless steel and supported by a stand 6b of a square cross-section rigidly fixed on the upper surface of the main printed circuit board 1 by a rivet 7 or the like at a position corresponding to a respective, inverted auxiliary printed circuit board 2. Each inverted auxiliary printed circuit board 2 is supported at the four corners thereof by the tip, or corner, ends of the cross-shaped spring member 6a and positioned thereby above the main printed circuit board 1 in a floating manner. Thus, as shown in FIG. 4, an assembly A of printed circuit boards is formed.

Figure 5:
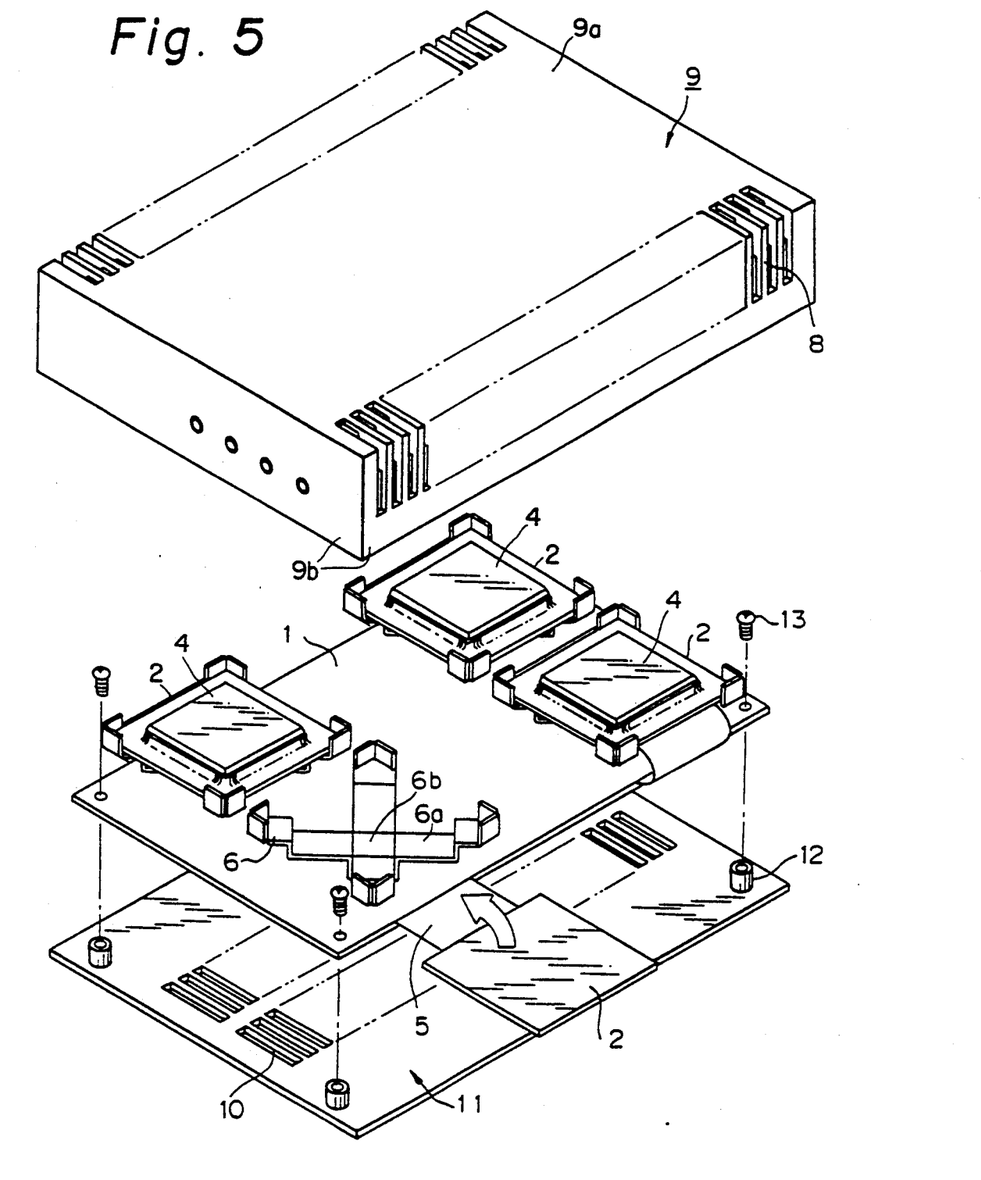
FIG. 5 is an exploded perspective view of a cooling structure according to the present invention.

The assembly A is accommodated in a housing B consisting of a box-like upper half body 9 having a main wall 9a and side walls 9b made of a thermally conductive material, such as an aluminum alloy, having a plurality of fins 8 formed by perpendicular incisions cut into a ridge line of the half body 9 defined at the integral junctures between the top wall 9a and the side walls 9b, as shown in FIG. 5 for two parallel such ridge lines, and a plate-like lower half body 11 with a plurality of ventilation slits 10 therein.

Figure 6:
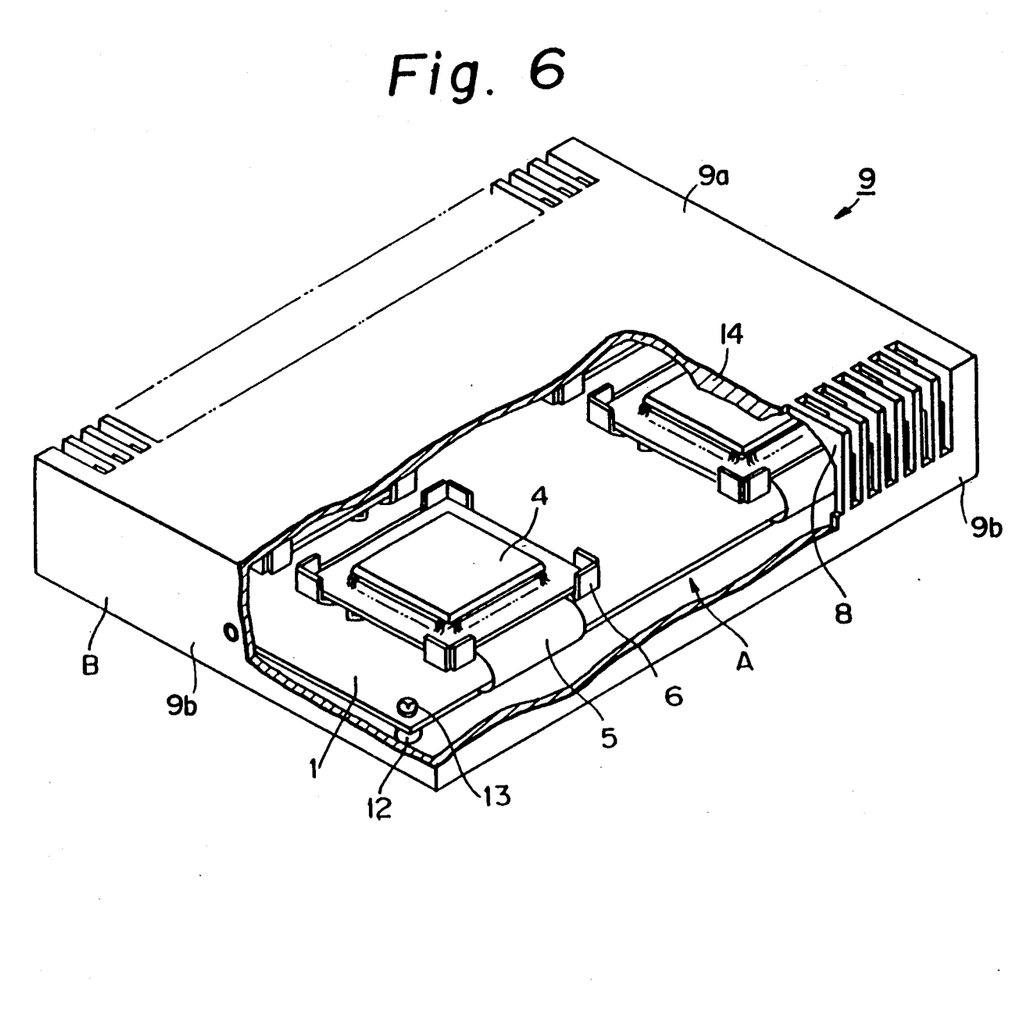
FIG. 6 is a partially broken perspective view of an assembled cooling structure according to the present invention.

As shown in FIG. 5 and 6, the main printed circuit board 1 is fixedly secured by screws 13 on the respective studs 12 protruding from the bottom wall of the lower half body 11 at four corners thereof, while each auxiliary printed circuit board 2 is maintained on the main printed circuit board 1 by its associated holder 6. Then the upper half body 9 is capped thereon, whereby a downwardly protruding, thicker section 14 of the main wall 9a is brought into contact with the heat-conductive surface of each second electronic device 4 and pushes the same downwardly against the elastic force of the spring member 6a of the associated holder 6. Each thicker area 14 is formed, corresponding to the position of the second electronic device 4 mounting on the associated auxiliary printed circuit board 2, on the inner surface of the top, or main, wall 9a of the upper half body 9. Accordingly, even though there are small height differences between the plural second electronic devices 4, any such difference is absorbed by the elasticity of the corresponding spring members 6a and close contact is assured between the thicker area 14 and the respective second electronic device 4 with a proper contacting pressure. Heat generated from each second electronic device 4 is effectively transmitted to the upper half body 9 and radiated from the outer surface thereof by the fins 8 into the outer (i.e., ambient) air.

Figure 4:
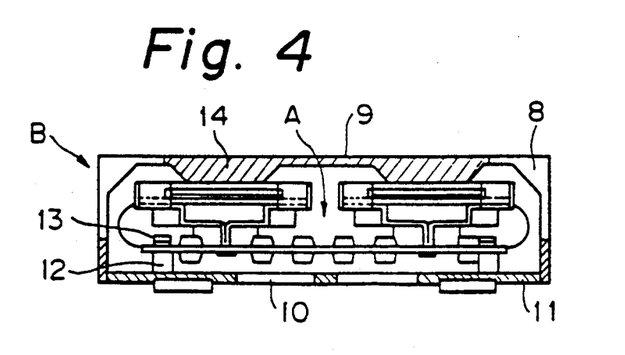
FIG. 4 is a side sectional view of the printed circuit board assembly accommodated in a housing.

As shown in FIG. 4, as the ridge line area of the upper half body 9 is increased, the outer surface of the fins 8 formed in this area is correspondingly increased and made large, whereby effective heat radiation is possible.

The first electronic device 3 having low heat generation can be cooled by an air stream introduced from outside into the housing B through the slits 10 caused by natural convection, which air stream passes through the incisions between the fins 8 and is discharged outside.

The cooling structure according to the present invention has the following advantages compared with the conventional structure:

1. As the auxiliary printed circuit board is held above the main printed circuit board in a resilient and floating manner by a special holder structure, the second electronic device, having high heat generation and since mounted on the auxiliary printed circuit board, can be brought into close contact with the inner wall (i.e., the interior protrusions 14) of the housing B by elastic pressure. Thereby even though there is a little height difference between the respective electronic devices mounted on the auxiliary printed circuit boards, this difference is absorbed by the holder so that the electronic devices can be always be brought into close contact with the inner wall of the housing with appropriate pressure.

2. According to the conventional cooling structure, the fin plate is fixed directly on the heat generating electronic device. According to the present invention, each electronic device 4 is resiliently pressed against the heat conductive means whereby the stress applied to the soldered portion of the electronic device is reduced and the same is not damaged.

3. As the housing B has a wall portion which is thicker in the area (i.e., protrusion 14) with which each corresponding electronic device 4 is brought into contact than in the other areas thereof, the cooling effect is enhanced due to the increased thermal capacity.

4. As the holder 6 is fixed on the main printed circuit board 1 by a relatively thin stand 6b at the center thereof, the space occupied by the stand 6b is very small, whereby the available space for mounting electronic parts on the main printed circuit board 1 is not substantially reduced.

Figure 7:
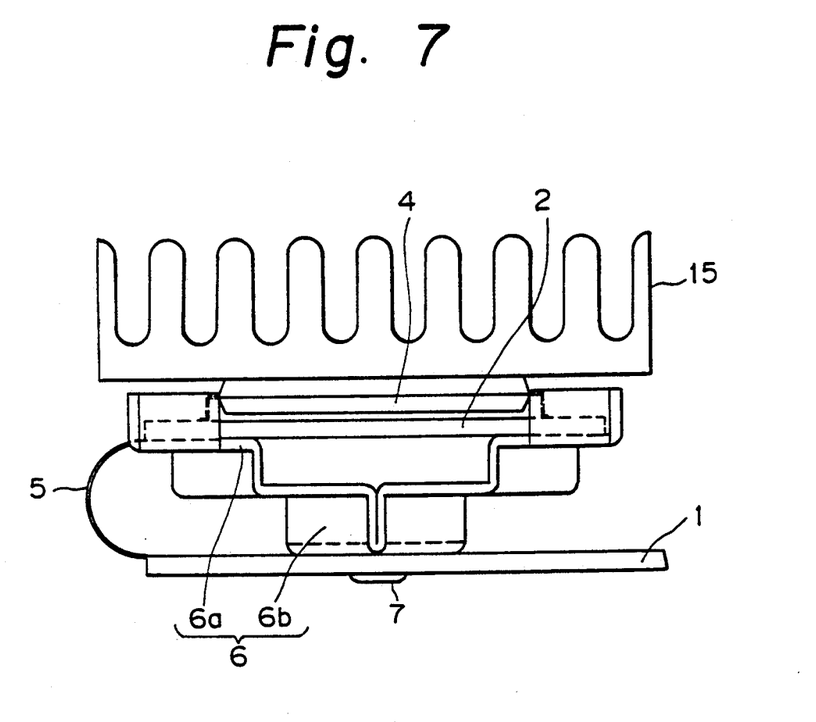
FIG. 7 is a side elevational view of a cooling structure according to another embodiment of the present invention.

The cooling structure according to the present invention may be formed by combining a holder 6 with a conventional fin plate 15 allocated to an individual second electronic device 4, as shown in FIG. 7.

We claim:

1. A cooling structure for assembling electronic devices, such as LSI devices, in a housing and comprising:
    a main printed circuit board having first and second main surfaces and at least one lateral edge and further having mounted on the first main surface thereof at least a first said electronic device which generates a first level of heat in operation;
    at least one auxiliary printed circuit board having first and second main surfaces and at least one lateral edge corresponding to at least a portion of a respective lateral edge of the main printed circuit board and further having mounted on the second main surface thereof at least a second said electronic device which generates a second level of heat in operation, which is relatively higher than the first level of heat, each said second electronic device having a generally planar heat conducting surface and a mounting surface and being mounted on the auxiliary printed circuit board with the mounting surface thereof adjacent the first main surface of the auxiliary printed circuit board and with the heat conducting surface thereof generally parallel to and displaced remotely from, and thereby projecting away from, the second main surface of the auxiliary printed circuit board;
    each of said main and auxiliary printed circuit boards further having electrical conducting paths providing interconnections between the respective electronic devices mounted thereon and the respective lateral edges thereof;
    a flexible printed circuit tape associated with each said auxiliary printed circuit board and extending therefrom to the main printed circuit board, the tape having a first end connected to the lateral edge of the associated auxiliary printed circuit board and a second end connected to the respective lateral edge of the main printed circuit board and including electrical conducting paths therein for electrically interconnecting the corresponding and respective electrical conducting paths of the auxiliary and main printed circuit boards;
    a holder, associated with each auxiliary printed circuit board and secured to the first surface of the main printed circuit board, for receiving and holding the associated auxiliary printed circuit board in a holding position in which the first main surface of the auxiliary printed circuit board is generally parallel to but displaced from the first main surface of the main printed circuit board and in which the second main surface of the auxiliary printed circuit board, and thereby also the generally planar heat conducting surface of the associated second electronic device mounted thereon, is remote from and projects away from the first main surface of the main printed circuit board, the flexible printed circuit tape being sufficiently resilient for being bent into a substantially U-shaped configuration when the associated auxiliary printed circuit board is received by and held in the holding position by the associated holder; and
    said housing being of a size and dimension for encompassing the main and auxiliary printed circuit boards therewithin and further comprising heat conductive means, associated with each said second electronic device and engaging the associated heat conductive surface thereof in thermal contact therewith, for transferring heat from the heat conductive surface of the second electronic device to the exterior of the housing.

2. A cooling structure as recited in claim 1, wherein each holder comprises a planar, cross-shaped spring member defining four corner holders and a stand element extending transversely to the planar spring element from the center thereof and engaged in the main printed circuit board, the auxiliary printed circuit board having four corners respectively received in and held by the four corner holders of the spring member.

3. A cooling structure as recited in claim 1, wherein the heat conductive means of the housing is pressed onto each second electronic device, thereby depressing the spring member of the associated holder, when the main printed circuit board and each auxiliary printed circuit board, with the respective first and second electronic devices mounted thereon, are assembled in the housing.

4. A cooling structure as recited in claim 3, wherein the heat conductive means comprises:
    a box-like upper half body of the housing having a planar top wall, planar side walls extending transversely from the top wall and each side wall defining a ridge line at the connection thereof with the top wall; and
    a plurality of fins disposed along at least one of the ridge lines and extending inwardly of the box-like upper half body from, and transversely to, the top wall and the associated side wall defining the ridge line.

5. A cooling structure as recited in claim 4, wherein the interior surface of the top wall of the box-like upper half body has a thicker dimension, in a direction transverse to the planar top wall, in the portions thereof which respectively correspond to the second electronic devices and associated auxiliary printed circuit boards, thereby to firmly engage same when the main printed circuit board and each auxiliary printed circuit board with a respective second electronic device mounted thereon are assembled within the housing, thereby to enhance the thermal conductance therebetween and accordingly the transfer of heat from the heat conductive surface of each second electronic device to the exterior of the housing.

* * * * *

UNITED STATES PATENT AND TRADEMARK OFFICE
CERTIFICATE OF CORRECTION

PATENT NO. : 5,243,218
DATED : Sep. 7, 1993
INVENTOR(S) : ZENITANI et al.

It is certified that error appears in the above-indentified patent and that said Letters Patent is hereby corrected as shown below:

COVER PAGE: [57] ABSTRACT, last line, change "hosing" to --housing--.

Col. 2, line 15, change "produce" to --produces--;
line 23, after "that" insert --a--;
line 55, change "and" to --end--;
line 62, change "o f" to --of--;
line 66, delete "[I—I]".

\* Col. 4, line 55, delete "be" (first occurrence).

Signed and Sealed this

Nineteenth Day of July, 1994

Attest:

BRUCE LEHMAN

*Attesting Officer*   *Commissioner of Patents and Trademarks*